US009082526B2

(12) United States Patent
Arenella et al.

(10) Patent No.: US 9,082,526 B2
(45) Date of Patent: Jul. 14, 2015

(54) SHIELDED ELECTRICAL SIGNAL CABLE

(75) Inventors: Kenneth Arenella, Wappingers Falls, NY (US); Alma Jaze, Astoria, NY (US); Alan H. Knight, Cary, NC (US); Kwok M. Soo Hoo, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 13/531,990

(22) Filed: Jun. 25, 2012

(65) Prior Publication Data

US 2013/0341064 A1 Dec. 26, 2013

(51) Int. Cl.

| | |
|---|---|
| ***H01B 9/02*** | (2006.01) |
| ***H01B 11/06*** | (2006.01) |
| ***H05K 9/00*** | (2006.01) |
| ***H01B 7/17*** | (2006.01) |

(52) U.S. Cl.

CPC .......................................... *H01B 7/17* (2013.01)

(58) Field of Classification Search

CPC ............. H01B 7/0861; H01B 11/1091; H01B 11/1033; H01B 11/1808; H01B 11/1834; H01B 7/226; H01B 11/00

USPC .......... 174/33, 34, 36, 75 C, 78, 88 C, 102 R, 174/105 B, 105 R, 107, 113 R, 117 AS, 145, 174/350

See application file for complete search history.

(56) References Cited

U.S. PATENT DOCUMENTS

| | | | | |
|---|---|---|---|---|
| 2,796,463 | A * | 6/1957 | Mallinckrodt | 178/45 |
| 3,643,007 | A * | 2/1972 | Roberts et al. | 174/106 R |
| 3,896,380 | A * | 7/1975 | Martin | 455/523 |
| 4,129,841 | A * | 12/1978 | Hildebrand et al. | 333/237 |
| 4,871,883 | A * | 10/1989 | Guiol | 174/36 |
| 5,414,213 | A * | 5/1995 | Hillburn | 174/36 |
| 5,473,336 | A * | 12/1995 | Harman et al. | 343/790 |
| 6,207,901 | B1 * | 3/2001 | Smith et al. | 174/102 R |
| 6,545,220 | B2 * | 4/2003 | Syed et al. | 174/75 C |
| 6,686,538 | B2 | 2/2004 | Yamamoto | |
| 7,033,213 | B2 * | 4/2006 | Dove | 439/578 |
| 7,332,676 | B2 | 2/2008 | Sparrowhawk | |
| 7,446,258 | B1 * | 11/2008 | Sosna et al. | 174/33 |
| 7,550,984 | B2 * | 6/2009 | Lesher et al. | 324/755.11 |
| 7,834,270 | B2 | 11/2010 | Zhu et al. | |
| 7,923,641 | B2 | 4/2011 | Smith et al. | |
| 2005/0205278 | A1 * | 9/2005 | Maruyama et al. | 174/33 |
| 2006/0048961 | A1 | 3/2006 | Pfeiler et al. | |

FOREIGN PATENT DOCUMENTS

| | | |
|---|---|---|
| WO | 2010003215 A1 | 1/2010 |
| WO | 2011087866 A2 | 7/2011 |

* cited by examiner

*Primary Examiner* — Timothy Thompson
*Assistant Examiner* — Sherman Ng
(74) *Attorney, Agent, or Firm* — Edward J. Wixted, III; Noah A. Sharkan

(57) ABSTRACT

Aspects of the present invention provide shielded cables for reducing the incidence of ground loops between connected electronic devices. According to one aspect of the present invention, a shielded cable is disclosed having two inner shield segments and an outer shield. The inner shield segments can each be grounded, but are physically separated from each other by a gap. The external shield is not grounded, and serves to contain EMI generated by signal conductors within the shielded cable and shield the signal conductors against external electrical events.

16 Claims, 4 Drawing Sheets

SHIELDED ELECTRICAL SIGNAL CABLE

FIELD OF THE INVENTION

The present invention relates generally to electrical cables and, more particularly, to shielded electrical signal cables.

BACKGROUND

Electrical signal cables that connect electronic devices include one or more signal conductors (e.g., one or more twisted pairs of copper wires, or a copper core). Electromagnetic interference (EMI) can introduce electrical noise into the signal conductors, which can weaken and potentially corrupt the signals being transmitted thereon. Shielded electrical signal cables ("shielded cables") can be used to reduce the amount of electrical noise that is introduced into the signal conductors and maintain the integrity of the electrical signals that are transmitted between electronic devices.

In a typical shielded cable, the signal conductors are covered with an insulating sheath, followed by a conductive shield and an outer jacket. The conductive shield is often grounded at one or both ends of the shielded cable, and serves to contain EMI emitted by the signal conductors and shield the signal conductors from external electrical events.

Grounding both ends of a shield of a shielded cable can introduce a ground loop between the connected electronic devices. For example, two electronic devices that are connected by a shielded cable may use separate power connections, creating a difference in their respective ground potentials. Consequently, a ground loop can be formed where ground current is introduced into the shield of the shielded cable and flows between the electronic devices to achieve equal potential. Such a ground loop can introduce noise into the signal conductors, as the shield can both emit and receive EMI. In addition, the ground loop can present a shock hazard, as exposed components of the electronic devices that are seemingly at ground potential can become energized. In the context of signal cables used to connect sensitive electronic devices in critical applications, such as electronic devices in mainframe computer systems, the noise introduced into the signal conductors can corrupt the data being transmitted thereon, potentially resulting in errors and system down time. Further, the coupled EMI from the ground loop can prevent concurrent system upgrades and related maintenance activities from being safely performed. Grounding only one end of the shield eliminates the ground current path through the shield, but the shield can still introduce noise into the signal conductors by emitting and receiving EMI, particularly at radio frequencies.

SUMMARY

Aspects of the present invention provide shielded cables for reducing the incidence of ground loops between connected electronic devices. According to one aspect of the present invention, there is provided a shielded cable comprising: a signal conductor having a length; a first shield segment disposed coaxially around the signal conductor, the first shield segment for shielding the signal conductor and connecting to a ground potential of a first electronic device; a second shield segment disposed coaxially around the signal conductor, the second shield segment being separated from the first shield segment by a gap interposed between the first shield segment and the second shield segment, the second shield segment for shielding the signal conductor and connecting to a ground potential of a second electronic device; and an outer shield disposed coaxially around the first shield segment, the second shield segment, and the gap, the outer shield being separated from the first shield segment and the second shield segment by a dielectric material.

DETAILED DESCRIPTION

Briefly, one aspect of the present invention discloses a shielded cable having two inner shield segments and an outer shield. The inner shield segments are each connected at one end of the cable to a connector, which can in turn be coupled to chassis grounds of the respective electronic devices to which the connectors are connected. The inner shield segments are physically separated from each other by a gap, which eliminates the ground loop current path between the connected electronic devices via the inner shield segments. The external shield is insulated from the inner shield and is not grounded. The external shield provides shielding against external transient events via its capacitance and inductive coupling to the inner shield segments. The external shield also serves to contain EMI generated by signal conductors within the shielded cable.

Embodiments of the present invention will now be described in detail with reference to the accompanying drawings. It is to be understood that the disclosed embodiments are merely illustrative of potential embodiments of the present invention and may take various forms. In addition, each of the examples given in connection with the various embodiments is intended to be illustrative, and not restrictive. Further, the figures are not necessarily to scale, and elements and features can have different dimensions than those depicted in the figures. Therefore, specific structural and functional details disclosed herein are not to be interpreted as limiting, but merely as a representative basis for teaching one skilled in the art to variously employ the present invention.

References in the specification to "an exemplary embodiment," "other embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
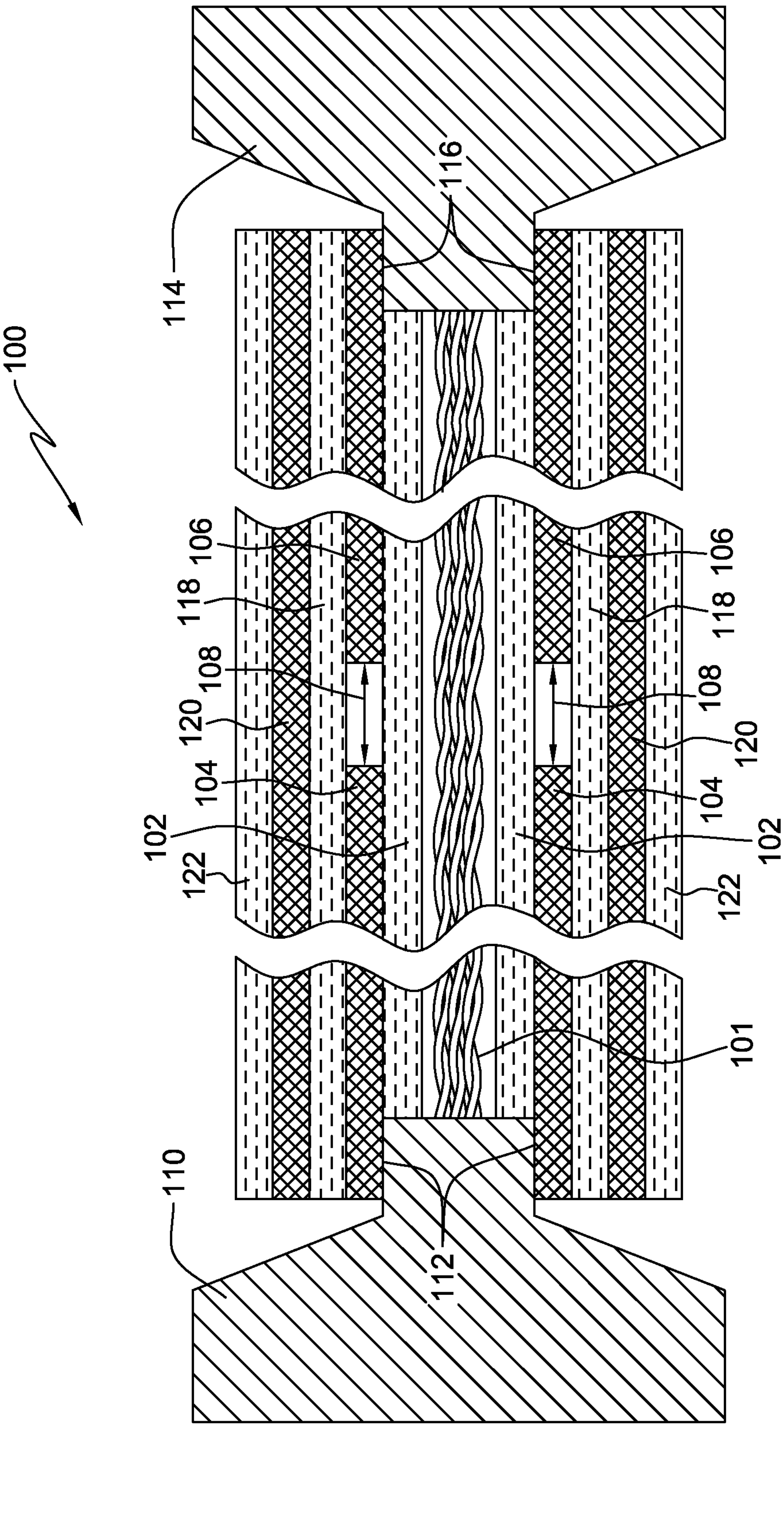
FIG. 1 is a cross-sectional view of a shielded cable in accordance with an embodiment of the present invention.
Figure 2:
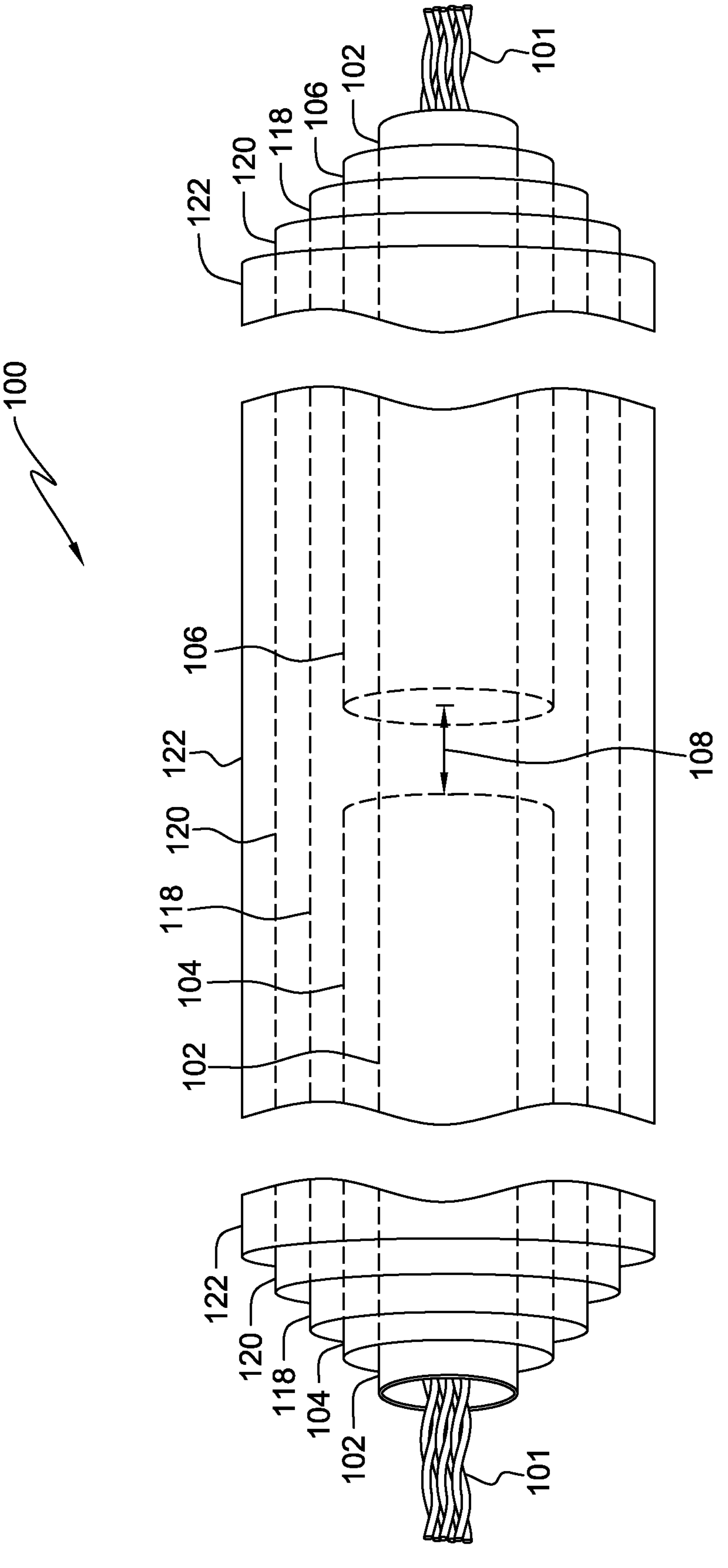
FIG. 2 is a perspective view of the shielded cable of FIG. 1.

FIG. 1 is a cross-sectional view of a shielded cable 100 in accordance with an embodiment of the present invention. FIG. 2 is a perspective view of shielded cable 100 of FIG. 1, without connectors 110 and 114.

Signal conductors 101 carry electrical signals between electronic devices connected by shielded cable 100. In this exemplary embodiment, signal conductors 101 are a plurality of twisted wire pairs that are terminated at each end of shielded cable 100 via connectors 110 and 114, respectively.

Connectors 110 and 114 represent generally any connector that is compatible with electronic devices to be connected via shielded cable 100 in a desired application or environment.

Insulating sheath 102 is disposed coaxially around signal conductors 101. In other embodiments, insulating sheath 102 is not present. Inner shield segments 104 and 106 are disposed coaxially around insulating sheath 102. Inner shield segment 104 has a radius about equal to the radius of inner shield segment 106. Inner shield segments 104 and 106 are separated from each other by gap 108. In this exemplary embodiment, gap 108 is a void interposed between inner shield segments 104 and 106. In other embodiments, gap 108 is a dielectric material interposed between inner shield segments 104 and 106. Inner shield segments 104 and 106 can be implemented with a variety of conductive shield materials, such as, for example, braided wire, foil, and combinations of both.

In this exemplary embodiment, one end of inner shield segment 104 is connected to connector 110 via circumferential termination (shown at region 112). Inner shield segment 104 can be grounded (i.e., connected to a ground potential), for example, via electrical coupling of connector 110 to the chassis ground of an electronic device to which connector 110 is connected (not shown). In this exemplary embodiment, one end of inner shield segment 106 is connected to connector 114 via circumferential termination (shown at region 116). Inner shield segment 106 can be grounded, for example, via electrical coupling of connector 114 to the chassis ground of an electronic device to which connector 114 is connected (not shown). Inner shield segments 104 and 106 can also be connected to connectors 110 and 114, respectively, via other methods, such as with EMI backshells, overbraids, and drain wires.

As depicted, inner shield segments 104 and 106 are approximately of equal length such that gap 108 is positioned at the approximate longitudinal midpoint of shielded cable 100. The lengths of inner shield segments 104 and 106 can be varied such that gap 108 is positioned nearer to a particular end of shielded cable 100. Similarly, the lengths of inner shield segments 104 and 106 can be varied such that the length of gap 108 (i.e., the distance between inner shield segments 104 and 106) is increased or decreased.

Insulating layer 118 is disposed coaxially around inner shield segments 104 and 106 and the portion of insulating sheath 102 exposed by gap 108. Insulating layer 118 can be implemented with a variety of dielectric materials, such as, for example, Mylar® or Teflon®.

Outer shield 120 is disposed coaxially around insulating layer 118. Outer shield 120 is not electrically connected to connectors 110 and 114 at either end, and outer shield 120 is insulated from inner shield segments 104 and 106 by insulating layer 118. Outer shield 120 can be implemented with a variety of conductive shield materials, such as, for example, braided wire, foil, and combinations of both.

Outer jacket 122 is disposed coaxially around outer shield 120. Outer jacket 122 can be implemented with plastics or other known dielectric materials.

Accordingly, in this exemplary embodiment, inner shield segments 104 and 106 can each be grounded at one end of shielded cable 100, but gap 108 eliminates the ground loop current path between electronic devices connected by shielded cable 100. Outer shield 120 is not grounded and therefore also does not provide a ground loop current path between electronic devices connected by shielded cable 100. Inner shield segments 104 and 106 also serve to contain EMI emitted by signal conductors 101, which can prevent EMI emitted by shielded cable 100 from interfering with electronic devices or introducing electrical noise into other signal cables.

Outer shield 120 shields signal conductors 101 via its capacitance and inductive coupling to inner shield segments 104 and 106, which can conduct to ground electrical current that might otherwise introduce noise into signal conductors 101. Outer shield 120 also serves to contain EMI emitted by signal conductors 101 that might escape through gap 108, which can further prevent EMI emitted by shielded cable 100 from interfering with electronic devices or introducing electrical noise into other signal cables.

Figure 3:
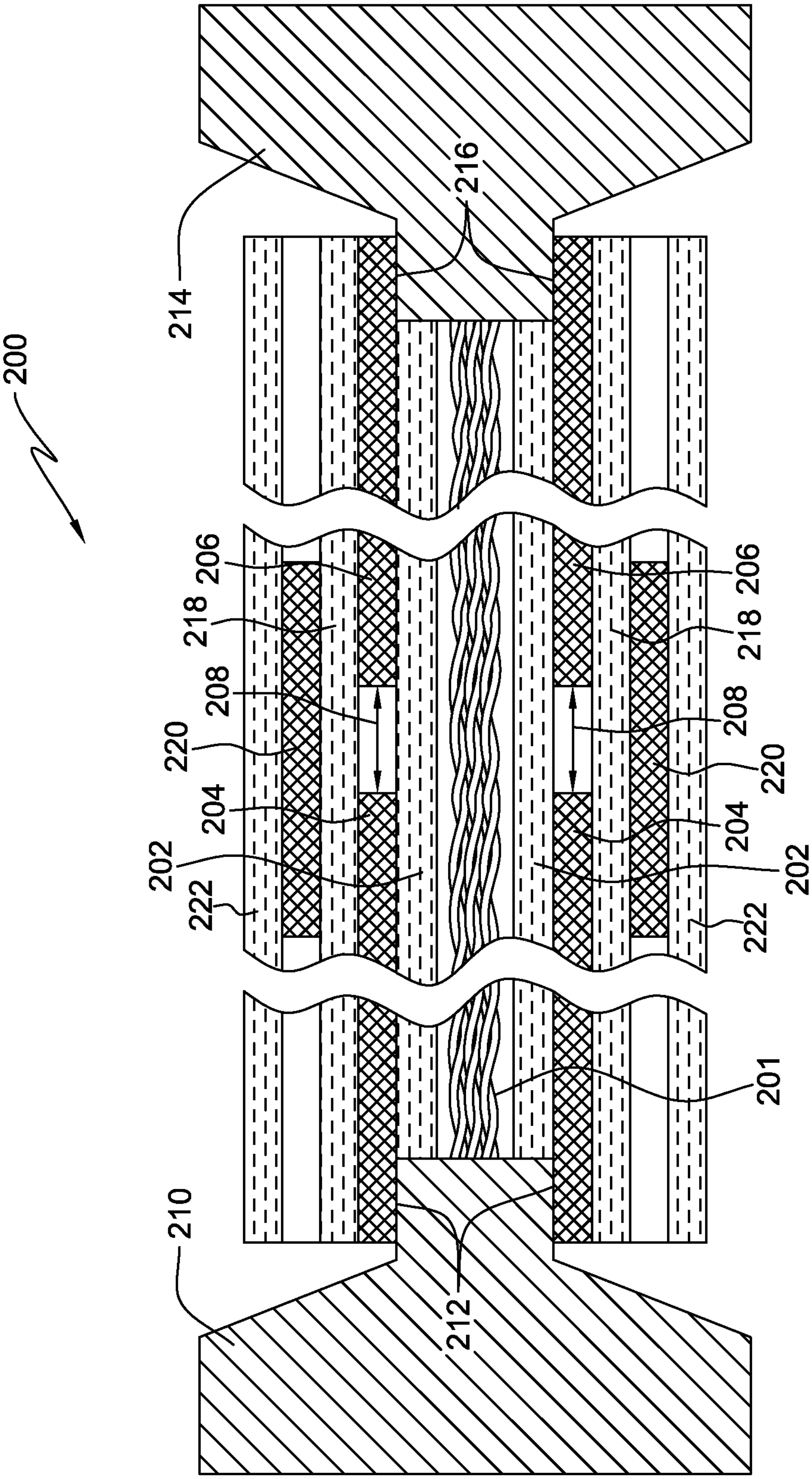
FIG. 3 is a cross-sectional view of a shielded cable in accordance with another embodiment of the present invention.
Figure 4:
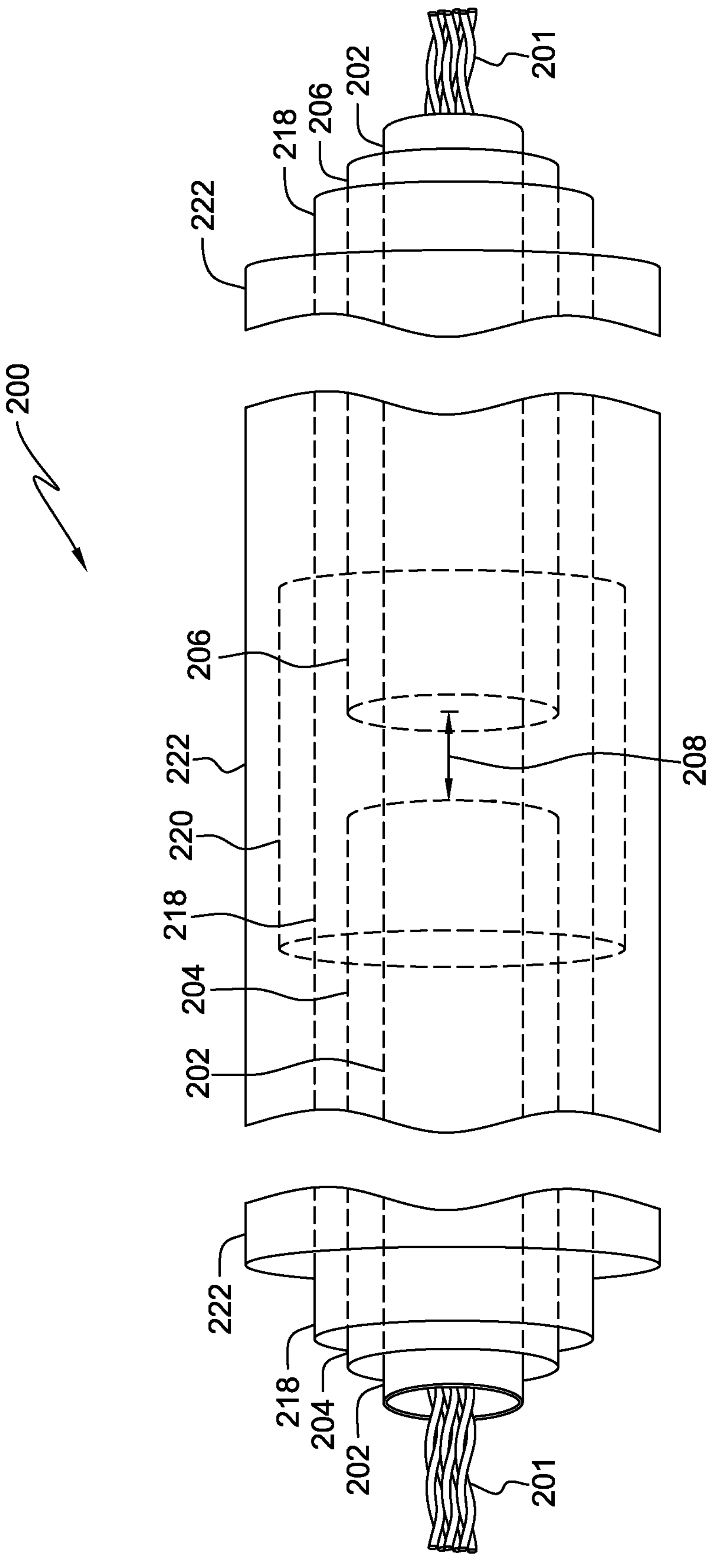
FIG. 4 is a perspective view of the shielded cable of FIG. 3.

FIG. 3 is a cross-sectional view of a shielded cable 200 in accordance with an embodiment of the present invention. FIG. 4 is a perspective view of shielded cable 200 of FIG. 3, without connectors 210 and 214. Shielded cable 200 is similar to shielded cable 100, but differs with respect to outer shield 220. Accordingly, for an explanation of signal conductors 201, insulating sheath 202, inner shield segments 204 and 206, gap 208, connectors 210 and 214, regions 212 and 216, insulating layer 218, and outer jacket 222, please refer to the discussions of signal conductors 101, insulating sheath 102, inner shield segments 104 and 106, gap 108, connectors 110 and 114, regions 112 and 116, insulating layer 118, and outer jacket 122, respectively.

In this exemplary embodiment, outer shield 220 is disposed coaxially around insulating layer 118 along a portion of the length of insulating layer 218, and outer shield 220 is positioned such that it overlaps gap 208. Outer shield 220 is not grounded at either end, and outer shield 220 is separated from inner shield segments 204 and 206 by insulating layer 218. Outer shield 220 can be implemented with a variety of conductive shield materials, such as, for example, braided wire, foil, and combinations of both.

Outer shield 220 serves to contain EMI emitted by signal conductors 201 that might escape through gap 208. In this embodiment, outer shield 220 is positioned relative to gap 208 such that its approximate longitudinal midpoint is aligned with the approximate longitudinal midpoint of gap 208. The length of outer shield 220, as well its positioning relative to gap 208, can be adjusted such that outer shield 220 functions as a waveguide to cutoff EMI frequencies of concern in a particular application.

The foregoing description of various embodiments of the present invention has been presented for purposes of illustration and description. It is not intended to be exhaustive nor limit the invention to the precise form disclosed. Many modifications and variations of the present invention are possible. Such modifications and variations that may be apparent to a person skilled in the art of the invention are intended to be included within the scope of the invention as defined by the accompanying claims.

What is claimed is:

1. A shielded cable comprising:

a signal conductor having a length;

a first shield segment disposed coaxially around the signal conductor, the first shield segment for shielding the signal conductor, one end of the first shield segment connecting to a ground potential of a first electronic device;

a second shield segment disposed coaxially around the signal conductor, the second shield segment being separated from the first shield segment by a gap interposed between the first shield segment and the second shield segment, the second shield segment for shielding the signal conductor, one end of the second shield segment connecting to a ground potential of a second electronic device; and an outer shield continuously disposed along a length between the one end of the first shield segment and the one end of the second shield segment, and coaxially around the first shield segment, the second shield segment, and the gap, the outer shield being separated from the first shield segment and the second shield segment by a dielectric material.

2. The shielded cable of claim 1, wherein the outer shield is connected to neither the ground potential of the first electronic device nor the ground potential of the second electronic device.

3. The shielded cable of claim 1, wherein the gap is a void interposed between the first shield segment and the second shield segment.

4. The shielded cable of claim 1, wherein the gap is a dielectric material interposed between the first shield segment and the second shield segment.

5. The shielded cable of claim 1, wherein the first shield segment has a radius about equal to a radius of the second shield segment.

6. The shielded cable of claim 1, wherein the first shield segment, the second shield segment, and the outer shield include one or more conductive materials selected from the group consisting of: braided wire and foil.

7. A shielded cable comprising:

a signal conductor having a length;

a first shield segment disposed coaxially around the signal conductor, one end of the first shield segment being connected to a first connector, the first connector for connecting to a first electronic device;

a second shield segment disposed coaxially around the signal conductor, the second shield segment being separated from the first shield segment by a gap interposed between the first shield segment and the second shield segment, one end of the second shield segment being connected to a second connector, the second connector for connecting to a second electronic device; and an outer shield continuously disposed along a length between the one end of the first shield segment and the one end of the second shield segment, and coaxially around the first shield segment, the second shield segment, and the gap, the outer shield being separated from the first shield segment and the second shield segment by a dielectric material.

8. The shielded cable of claim 7, wherein the other shield is connected to neither the first connector nor the second connector.

9. The shielded cable of claim 7, wherein the gap is a void interposed between the first shield segment and the second shield segment.

10. The shielded cable of claim 7, wherein the gap is a dielectric material interposed between the first shield segment and the second shield segment.

11. The shielded cable of claim 7, wherein the first shield segment has a radius about equal to a radius of the second shield segment.

12. The shielded cable of claim 7, wherein the first shield segment, the second shield segment, and the outer shield include one or more conductive materials selected from the group consisting of: braided wire and foil.

13. The shielded cable of claim 1, wherein the outer shield is not grounded.

14. The shielded cable of claim 1, wherein the first shield segment and the second shield segment are separated from the signal conductor by an insulating sheath.

15. The shielded cable of claim 7, wherein the outer shield is not grounded.

16. The shielded cable of claim 7, wherein the first shield segment and the second shield segment are separated from the signal conductor by an insulating sheath.

* * * * *